United States Patent [19]
Chand

[11] Patent Number: 5,665,637
[45] Date of Patent: Sep. 9, 1997

[54] PASSIVATED FACETED ARTICLE COMPRISING A SEMICONDUCTOR LASER

[75] Inventor: Naresh Chand, Berkeley Heights, N.J.

[73] Assignee: Lucent Technologies Inc., Murray Hill, N.J.

[21] Appl. No.: 560,148

[22] Filed: Nov. 17, 1995

[51] Int. Cl.$^6$ .................................................. H01L 21/20
[52] U.S. Cl. .................................... 372/46; 438/38
[58] Field of Search ............................ 437/129; 372/46

[56] References Cited

U.S. PATENT DOCUMENTS

| | | | |
|---|---|---|---|
| 4,337,443 | 6/1982 | Umeda et al. | 372/49 |
| 4,718,069 | 1/1988 | Streifer et al. | 372/46 |
| 4,719,634 | 1/1988 | Streifer et al. | 372/46 |
| 4,815,084 | 3/1989 | Scifres et al. | 372/46 |
| 4,828,935 | 5/1989 | Jonker | 428/642 |
| 5,063,173 | 11/1991 | Gasser et al. | 437/129 |
| 5,144,634 | 9/1992 | Grasser et al. | 372/49 |
| 5,171,717 | 12/1992 | Broom et al. | 437/226 |
| 5,280,535 | 1/1994 | Gfeller et al. | 372/46 |

Primary Examiner—Charles L. Bowers, Jr.
Assistant Examiner—Ramamohan Rao Paladugu
Attorney, Agent, or Firm—Eugen E. Pacher

[57] ABSTRACT

Provision of a novel passivation layer can result in improved reliability of semiconductor lasers having a laser cavity defined by 2 laser facets. In a preferred embodiment, the passivation layer is a zinc selenide layer (e.g., 5 nm), formed on an essentially contamination-free laser facet. More generally, the passivation layer comprises at least one of Mg, Zn, Cd and Hg, and at least one of S, Se and Te. Typically, the facets are formed by cleaving in vacuum, immediately followed by in-situ deposition of the novel passivation layer material on the facets.

6 Claims, 2 Drawing Sheets

PASSIVATED FACETED ARTICLE COMPRISING A SEMICONDUCTOR LASER

FIELD OF THE INVENTION

This invention pertains to semiconductor lasers, more specifically, to semiconductor lasers with passivated laser facets.

BACKGROUND OF THE INVENTION

Semiconductor lasers that comprise a laser cavity defined by two parallel laser facets are known. Among these are Fabry-Perot lasers and distributed feedback (DFB) lasers.

Despite much effort aimed at improving the reliability of lasers with facets, such lasers frequently are subject to early performance degradation and/or laser failure. This problem is particularly severe in high power lasers, e.g, in lasers that would otherwise be well suited as pump lasers for optical fiber amplifiers in optical communication systems.

The above referred-to performance degradation or failure typically is connected with degradation of one or both laser facets. Facet degradation modes include catastrophic optical damage (COD) and gradual degradation due to optically accelerated facet oxidation. The main cause of COD is believed to be local heating due to optical absorption and non-radiative recombination of optically generated carriers at the facets, and the resulting positive feedback. Furthermore, the dielectric facet coating itself or the impurities in the coating can react with the semiconductor laser facets in the presence of light, heat and bias energies, resulting in facet degradation.

It is known that laser performance degradation can be reduced by provision of a contamination-free facet, followed by in-situ application of a passivation layer. U.S. Pat. Nos. 5,063,173 and 5,144,634 disclose that the passivation layer consists of Si, Ge or Sb, and that the passivation layer is deposited in situ onto a contamination-free laser facet. U.S. Pat. No. 5,171,717 discloses apparatus for cleaving semiconductor wafers in a vacuum system. See also U.S. patent application 08/408,678, filed Mar. 22, 1995 by M. Hong et al., which discloses gallium oxide as a passivation layer.

Despite the substantial progress that has been made, it would be highly desirable to have available lasers with a readily deposited facet passivation layers that can have further improved reliability. This application discloses such lasers, and a method of making the lasers.

SUMMARY OF THE INVENTION

In a broad aspect the invention is embodied in an article that comprises an improved semiconductor laser of the type that comprises a laser cavity defined by two laser facets. Exemplarily, the article is an optical fiber amplifier that utilizes the improved laser as a pump laser, or an optical fiber communication system that comprises such amplifiers.

More specifically, a laser according to the invention has at least one facet that is covered by a passivation layer that was formed on the substantially contamination-free laser facet. Significantly, the passivation layer comprises at least one element selected from the group consisting of Mg, Zn, Cd and Hg, and further comprises at least One element selected from the group consisting of S, Se and Te. In a currently preferred embodiment the passivation layer comprises zinc selenide, and typically is a zinc selenide layer.

Those skilled in the art will know that epitaxial films of ZnSe (as well as other II/VI compounds) on GaAs are used in the layer structure of infrared detectors and semiconductor lasers that emit blue-green light.

A "laser facet" herein is a semiconductor surface that serves to define the laser cavity of a semiconductor laser. The laser facet may be formed by cleaving or by any other appropriate technique, and will, in the final product, typically be covered with non-semiconductor material.

By "in situ" formation of a passivation layer on a laser facet is meant herein formation of the passivation layer on the facet in a low pressure (e.g., pressure $<1 \times 10^{-6}$ Torr) environment, without prior exposure of the facet to the ambient or other contamination source.

By "zinc selenide" is meant herein material that consists essentially of Zn and Se, the Zn/Se atomic ratio typically being in the range 0.9–1.1. Analogous definitions apply to other passivation layer materials, e.g., to zinc telluride, cadmium sulfide, zinc selenide-telluride, or zinc magnesium sulfide-telluride.

Figure 1:
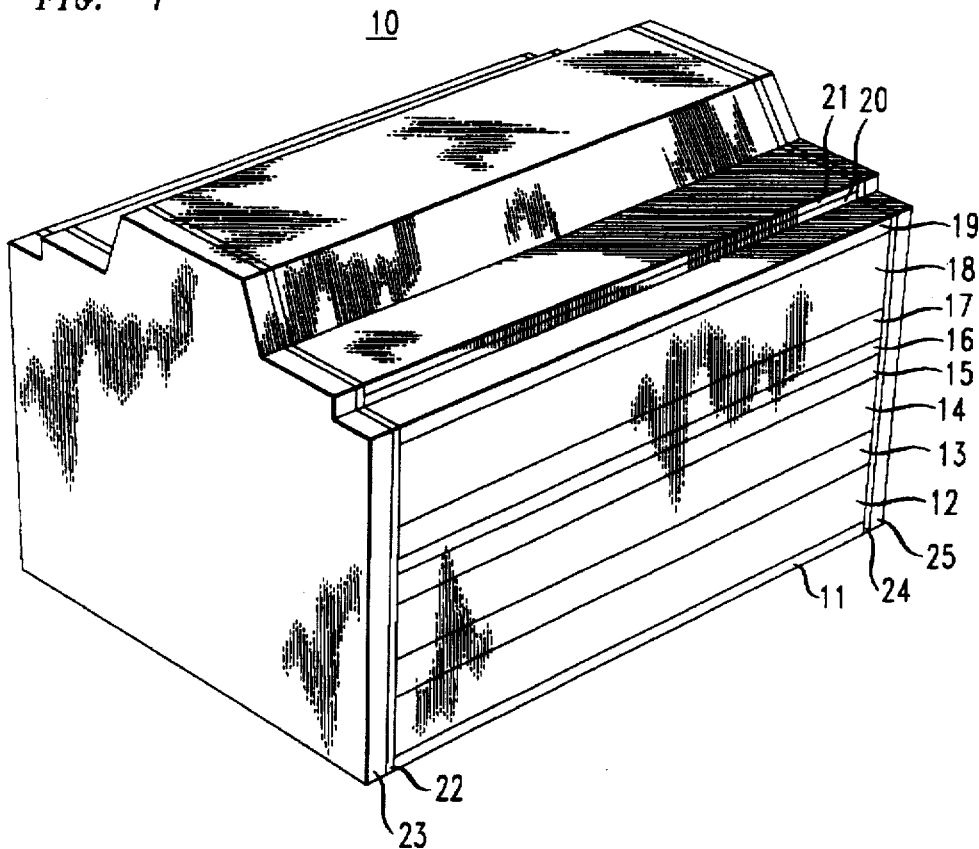
FIG. 1 schematically depicts an exemplary semiconductor laser according to the invention.

No attempt has been made to present features to scale or in proportion.

DETAILED DESCRIPTION

A desired III-V semiconductor laser layer structure is formed on a conventional III-V semiconductor substrate by any appropriate technique, e.g., MBE, MOCVD, CBE or LPE. For instance, the substrate is GaAs, and the layer structure comprises one or more of InGaAs, GaAs, InGaP or AlGaAs layers.

In an exemplary embodiment the semiconductor layer structure comprises, in sequence, a 0.5 µm n-GaAs buffer layer, a 1.2 µm n-InGaP cladding layer, a 0.1 µm GaAs spacer layer, a 6 nm InGaAs quantum well layer, a 0.1 µm GaAs spacer layer, a 1.1 µm p-InGaP cladding layer, a 2 nm p-GaAs stop etch layer, a 1.2 µm p-InGaP layer and a 0.12 µm p$^+$-GaAs layer. The layer structure was grown by MOCVD on a (10° off (100) towards <111>) A n-GaAs substrate. After growth, 5 µm wide mesa-type ridges were etched using conventional selective etches for GaAs and InGaP. Mesa etching was followed by deposition of necessary dielectric and ohmic metal contacts on n- and p- sides to fabricate window lasers, all in known fashion.

Subsequently, the wafer was cleaved into "triple" bars of 2250 µm width, followed by cleaving, in vacuum, into "single" bars of width 750 µm. Cleaving in vacuum can be carded out by any appropriate means. See, for instance, the '173 patent, which discloses apparatus for cleaving laser bars in vacuum. The vacuum pressure is selected, in accordance with other process parameters such as the delay time between cleaving and passivation, such that the passivation layer is formed on substantially contamination-free laser facets. As those skilled in the art will appreciate, this functional condition may require use of UHV if the delay is relatively long (e.g., more than a minute), but may permit use of relatively modest vacuum (e.g., $10^{-6}$ Torr) if the delay is very short (e.g., a second or less) or essentially zero, with intermediate pressures for intermediate delay times. Exemplary means for cleaving with very short or essentially zero delay are disclosed in a U.S. patent application entitled "A Fixture and Method for Laser Fabrication by In-Situ Cleaving of Semiconductor Bars", filed Oct. 30, 1995 by U. K. Chakrabarti et al.

In the above described exemplary procedure one 750 μm wide semiconductor bar on each side of the retained bar is sacrificed. This of course is not a necessary feature of the invention, and those skilled in the art will be able to devise methods that allow the use of more, possibly substantially all, of the semiconductor wafer. For instance, it would be an easy matter to shrink the width of the two sacrificial bars, e.g., design the vacuum cleaving apparatus such that it can accommodate sacrificial strips of width less than 750 μm each, e.g., 250 μm.

Cleaving in vacuum is not the only possible technique for preparing essentially contamination-free laser facets, and all such techniques are contemplated. For instance, the '173 patent discloses cleaving in air, followed by facet etching in vacuum, as another possible technique for preparing substantially contamination-free laser facets. By a "substantially contamination-free" laser facet is meant herein a facet that contains substantially only (e.g., >90 atomic %) group III and/or group V atoms, and contains substantially no (e.g., ≦10 atomic %) oxide or other foreign material.

Exemplarily, cleaving was carried out in a buffer chamber positioned between the load-lock and the deposition chamber of a thin film deposition system. The arrangement facilitated commencement of passivation layer deposition within 2 minutes after cleaving, a delay sufficiently short to insure deposition onto substantially contamination-free facets, due to the high vacuum (pressure <1×10$^{-8}$ Torr) in the buffer and deposition chambers.

The prior art teaches passivation of the substantially contamination-free facets with, for instance, a thin Si, Ge or Sb layer. Passivation with a gallium oxide layer has also been disclosed. We have made the surprising discovery that passivation, with, e.g., zinc selenide can result in lasers with significantly improved reliability, as compared to otherwise identical lasers without the novel passivation layer.

The passivation layer comprises at least one element of the group consisting of Mg, Zn, Cd and Hg, and at least one element of the group consisting of S, Se and Te. It will be noted that all members of the first group have +2 valence, and all members of the second group have −2 valence. Exemplary passivation layer materials are ZnSe, ZnTe, CdS, ZnS, Zn (Se, Te), Zn (S, Se), (Zn, Hg) Te, (Zn, Cd) Se, and (Zn, Mg) (S, Se). Typically the composition of the layer material is selected to give good lattice match to the facet material, e.g., less than 0.5% mismatch. Although the use of other +2 and/or −2 valence elements is not precluded, we currently believe that the specifically recited elements will have most utility, with ZnSe being currently most preferred. The above use of chemical formulas does not mean that the passivation layer materials necessarily have exact stoichiometric composition.

Exemplarily, a 5 nm thick film of zinc selenide was formed, by in-situ vapor deposition, on a substantially contamination-free laser facet. Deposition of the novel passivation layer is typically followed by conventional deposition of dielectric layers selected to have refractive index and thickness to yield a desired reflectivity, as is known to those skilled in the art.

Zinc selenide can be formed on the laser facets by any suitable deposition technique, e.g., by evaporation of ZnSe from an effusion cell at about 750° C. Such evaporation can result in formation of an essentially stoichiometric ZnSe film. However, slight departure of the composition of the deposit from the source composition is not precluded. Choice of relatively low cell temperature (e.g., <800° C.) is desirable since it minimizes outgassing due to radiation heating of the chamber walls and other hardware in the deposition chamber, thereby facilitating purity of the passivation layer and repeatability of results. Similar techniques can be used to deposit other passivation layer materials.

The exact reason for the observed improved reliability of lasers with zinc selenide passivation layer has not yet been elucidated, but practice of the inventive method does not require a knowledge of the operative factors. Possible factors include, in addition to the low evaporation temperature, a close lattice constant match between ZnSe and GaAs (only 0.27% mismatch), and low mechanical stress. Furthermore, optimal epitaxial deposition of ZnSe on GaAs occurs at relatively low temperature, e.g., about 300° C. In view of the low optimal deposition temperature it can be expected that zinc selenide, deposited onto unheated facets of GaAs-based lasers, will be of relatively higher crystalline quality than prior art passivation materials such as Si, which have substantially higher optimal deposition temperature.

ZnSe advantageously has a relatively wide bandgap of 2.75 eV, and thus does not absorb radiation of, e.g., 980 nm. A zinc selenide layer thus may also be used in laser facet mirror coatings of, e.g., 980 nm pump lasers for erbium doped optical fiber amplifiers.

After completion of formation of the passivation layer, mirror layers will typically be deposited on one or both passivated facets. Exemplarily, we deposited SiO dielectric films with thickness <λ/4 to obtain a low reflectivity mirror (about 2–5% reflectivity) on one facet. On the other facet, we deposited a λ/4 layer of SiO by MBD, followed by vapor deposition of λ/4 Si:λ/4 SiO, SiO$_2$ or yttria stablized zirconia (YSZ): λ/4 Si, resulting in a mirror reflectivity of >70%.

The above described mirrors are exemplary only. For instance, SiO can be replaced by Si$_3$N$_4$, Al$_2$O$_3$ or YSZ on the low reflectivity facet, and substantially any combination of one or multiple pairs of low and high index dielectric materials can be deposited on the high reflectivity facet. Formation of SiO layers is described, for instance, in U.S. Pat. No. 5,440,575.

FIG. 1 schematically depicts an exemplary laser (10) according to the invention, wherein numerals 11–19 refer, respectively, to n-side metallization layer, n-GaAs substrate, n-GaAs buffer, n-InGaP cladding, GaAs spacer layer, InGaAs quantum well layer, GaAs spacer layer, p-InGaP cladding, and p-GaAs stop etch layer, all exemplarily as described above. Numerals 20 and 21 respectively refer to a conventional dielectric (e.g., SiO$_2$) layer and a conventional metallization (e.g., Ti/Pt/Au) layer. Numerals 22 and 24 refer to the passivation layers, and 23 and 25 refer to (possibly but not necessarily multilayer) dielectric mirrors. Above etch stop layer 19 are disposed a p-InGaP layer and a p$^+$ GaAs contact layer. These two layers are not shown in FIG. 1.

After facet passivation and mirror deposition, individual lasers were separated from the laser bar and tested for electrical and optical properties. Lasers that pass an initial screening test were bonded p-side up and subjected to further tests. An exemplary series of tests included 1) a pre-age "snap" test (500 mA dc for a short period, 3 times);

2) a "purge" test (100° C., 150 mA dc, 140 hours);

3) a post-purge "snap" test (same as test 1.); and 4) an aging test (85° C., 300 mA dc, 1000 hours).

Most of the lasers we tested passed tests 1) and 2) above, regardless of the type of cleaving, passivation, and dielectric mirror material used. However, lasers that are not vacuum cleaved and suitably passivated generally fail test 3) due to COD. Significantly, lasers that are vacuum cleaved and passivated with zinc selenide generally pass tests 1)–4), whereas lasers that were vacuum cleaved but not passivated with zinc selenide even on one facet generally fail due to COD on that facet either during test 3) or 4).

For instance, 4 lasers as described above, UHV cleaved on both facets but without zinc selenide passivation, were tested. All four lasers failed, due to COD, during test 4) (failures after 16, 40, 66 and 360 hours). On the other hand, 10 lasers according to the invention that differed from the above mentioned 4 lasers only with regard to in situ zinc selenide passivation (5 nm zinc selenide), were subjected to the same series of tests, with all of the lasers passing all tests, including full test 4.

Not only have lasers according to the invention substantially improved resistance to COD, but such lasers also exhibit substantially less gradual deterioration of the laser output.

Figure 2:
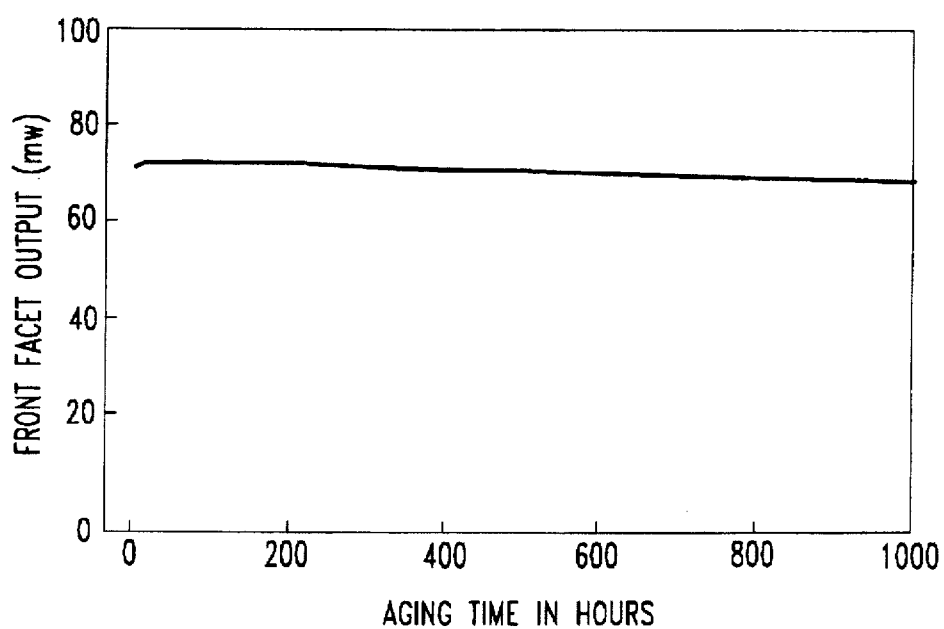
FIG. 2 shows data on laser power vs. aging time.

FIG. 2 shows exemplary data on front facet output during test 4) of a laser according to the invention. The stability of laser output power is evident from the data.

Figure 3:
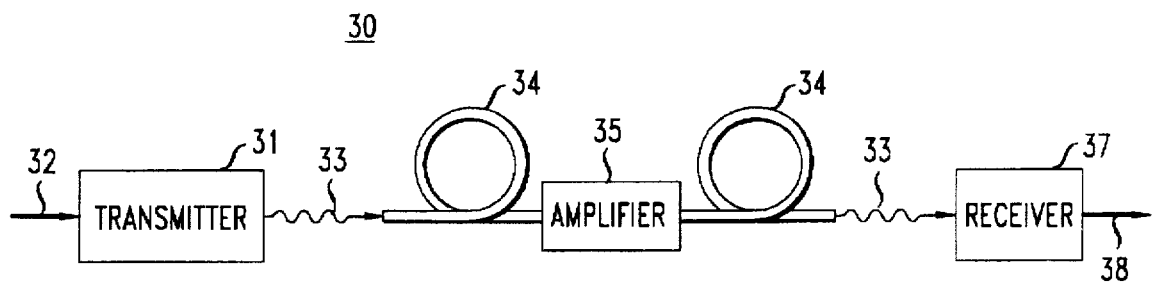
FIG. 3 schematically shows an optical fiber communication system that comprises a fiber amplifier comprising a pump laser according to the invention.

Exemplarily, lasers according to the invention are designed for emission of 0.98 μm radiation, and are used as pump lasers for erbium-doped fiber amplifiers (EDFA). Such amplifiers are known, and are already being used in optical fiber transmission systems. FIG. 3 schematically depicts such a system (30). Transmitter 31 emits radiation (e.g., 1.55 μm wavelength) 33 in response to input signal 32. The radiation is coupled into transmission fiber 34 and propagates through the fiber towards receiver 37, the receiver having electrical output 38. Intermediate the transmitter and the receiver is EDFA 35 (typically more than one such amplifier) that comprises one or more pump lasers according to the invention. This is shown in more detail in FIG. 4. Er-doped fiber 40 is disposed between transmission fibers 34. Pump laser 41 is a laser according to the invention. It emits radiation 42, exemplarily of wavelength 0.98 μm, the radiation is coupled into optical fiber 43 and guided to conventional fiber coupler 44, which provides for essentially complete transfer of pump energy into fiber 40.

Figure 4:
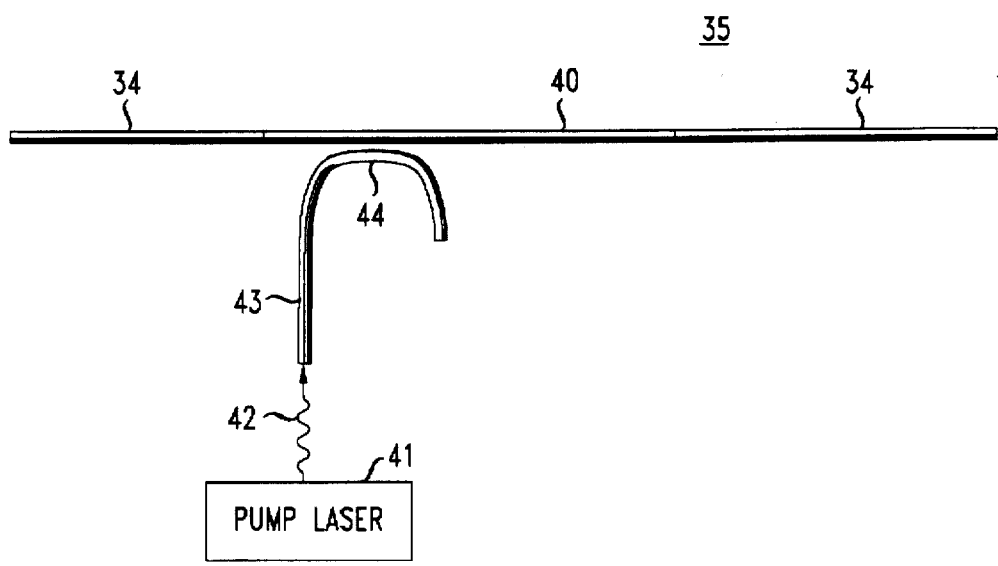
FIG. 4 schematically depicts the fiber amplifier of FIG. 3.

As will be evident to those skilled in the art, practical communication systems and EDFAs typically comprise a variety of known components (e.g., isolators, power amplifiers, pre-amplifiers, filters, couplers, etc.) that are not shown in FIGS. 3 and 4.

The above discussion was primarily in terms of GaAs-based pump lasers that emit at 0.98 μm. However, the novel technique is applicable to substantially all GaAs-based lasers that comprise laser facets, regardless of their operating wavelength and operating power, although high power lasers are most likely to benefit most from the inventive passivation. Furthermore, the technique is at least in principle applicable to other III/V lasers that comprise laser facets (e.g., InP-based lasers). However, these lasers typically are not high power lasers and thus are not subject to the reliability problems as are high power GaAs-based lasers.

The invention claimed is:

1. Article comprising a semiconductor laser having a laser cavity defined by two laser facets, at least one of said laser facets being covered by a passivation layer on a substantially contamination-free laser facet;

characterized in that the passivation layer comprises at least one element selected from the group consisting of Mg, Zn, Cd and Hg, and further comprises at least one element selected from the group consisting of S, Se and Te.

2. Article according to claim 1, wherein each laser facet is covered by a passivation layer on a substantially contamination-free laser facet, each passivation layer comprising Zn and Se.

3. Article according to claim 1, wherein disposed on the passivation layer are one more dielectric layers.

4. Article according to claim 2, wherein the semiconductor laser is selected to have output radiation of wavelength about 0.98 μm.

5. Article according to claim 4, wherein the article comprises an Er-doped optical fiber and means for coupling the 0.98 μm output radiation into the Er-doped optical fiber.

6. Article according to claim 1, wherein the article is an optical fiber communication system comprising a transmitter, a receiver, and an optical fiber transmission medium that signal-transmissively links said receiver and transmitter, said optical fiber transmission medium comprising an optical fiber amplifier comprising a pump laser.

* * * * *